(12) United States Patent
Martín de los Santos

(10) Patent No.: US 11,847,757 B2
(45) Date of Patent: *Dec. 19, 2023

(54) SYSTEMS AND METHODS FOR LEAN ORTHO CORRECTION FOR COMPUTER MODELS OF STRUCTURES

(71) Applicant: Insurance Services Office, Inc., Jersey City, NJ (US)

(72) Inventor: Ismael Aguilera Martín de los Santos, Madrid (ES)

(73) Assignee: Insurance Services Office, Inc., Jersey City, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 17/948,659

(22) Filed: Sep. 20, 2022

(65) Prior Publication Data

US 2023/0017465 A1  Jan. 19, 2023

Related U.S. Application Data

(63) Continuation of application No. 16/361,620, filed on Mar. 22, 2019, now Pat. No. 11,450,076.

(60) Provisional application No. 62/646,985, filed on Mar. 23, 2018.

(51) Int. Cl.
| | |
|---|---|
| *G06T 19/20* | (2011.01) |
| *G06T 17/20* | (2006.01) |
| *G06T 17/05* | (2011.01) |
| *G06F 30/13* | (2020.01) |

(52) U.S. Cl.
CPC ............... *G06T 19/20* (2013.01); *G06F 30/13* (2020.01); *G06T 17/05* (2013.01); *G06T 17/20* (2013.01); *G06T 2200/24* (2013.01); *G06T 2207/10032* (2013.01); *G06T 2207/30184* (2013.01); *G06T 2219/2004* (2013.01); *G06T 2219/2016* (2013.01); *G06T 2219/2021* (2013.01)

(58) Field of Classification Search
None
See application file for complete search history.

(56) References Cited

U.S. PATENT DOCUMENTS

| | | |
|---|---|---|
| 8,170,840 B2 | 5/2012 | Pershing |
| 9,911,228 B2 | 3/2018 | Pershing et al. |
| 11,450,076 B2 | 9/2022 | Martín de los Santos |
| 2014/0015924 A1 | 1/2014 | Pryor |

(Continued)

OTHER PUBLICATIONS

Extended European Search Report dated Jun. 18, 2019, issued by the European Patent Office in connection with European Application No. 19164723.9 (8 pages).

(Continued)

*Primary Examiner* — Yanna Wu
(74) *Attorney, Agent, or Firm* — McCarter & English, LLP

(57) ABSTRACT

A system and method for lean ortho correction for computer models of structures. The system displays an image of a structure on a user interface and projects a structure model onto the image. Next, the system identifies a first world three-dimensional ("3D") point in the image, a second world 3D point in the image, and a third world 3D point in the image. The system then transforms coordinates of the structure model using the first world 3D point, the second world 3D point, the third world 3D point, and a lean ortho correction algorithm.

18 Claims, 5 Drawing Sheets

(56) References Cited

U.S. PATENT DOCUMENTS

2014/0099035 A1* 4/2014 Ciarcia ............... G06V 10/757
                                                  382/216
2018/0053347 A1* 2/2018 Fathi .................... G06T 17/205
2019/0295328 A1    9/2019 Martín de los Santos

OTHER PUBLICATIONS

Office Action dated Apr. 8, 2020, issued in connection with U.S. Appl. No. 16/361,620 (13 pages).
Communication Pursuant to Article 94(3) EPC dated Jun. 3, 2020, issued by the European Patent Office in connection with European Application No. 19164723.9 (4 pages).
Office Action dated Oct. 6, 2020, issued in connection with U.S. Appl. No. 16/361,620 (16 pages).
Communication Pursuant to Article 94(3) EPC dated Nov. 8, 2021, issued by the European Patent Office in connection with European Application No. 19164723.9 (4 pages).
Notice of Allowance dated Feb. 15, 2022, issued in connection with U.S. Appl. No. 16/361,620 (8 pages).
Notice of Allowance dated May 13, 2022, issued in connection with U.S. Appl. No. 16/361,620 (5 pages).

* cited by examiner

SYSTEMS AND METHODS FOR LEAN ORTHO CORRECTION FOR COMPUTER MODELS OF STRUCTURES

CROSS-REFERENCE TO RELATED APPLICATIONS

The present application is a continuation of U.S. patent application Ser. No. 16/361,620 filed on Mar. 22, 2019, now U.S. Pat. No. 11,450,076 issued on Sep. 20, 2022, which claims priority of U.S. Provisional Patent Application No. 62/646,985 filed on Mar. 23, 2018, the entire disclosures of which are expressly incorporated herein by reference.

BACKGROUND

Technical Field

The present disclosure relates generally to the fields of computer vision and photogrammetry. More specifically, the present disclosure relates to systems and methods for lean ortho correction for computer models of structures

Related Art

In the fields of computer vision and photogrammetry, there is often a need to project three-dimensional computer models of structures onto images that are not perfect. For example, many digital images suffer from leaning which has not been corrected. In such circumstances, while the digital images may be identified as "orthorectified," the images are not true orthographic images due to the failure to correct leaning in the images. As a result, existing computer modeling systems can produce models of structures that are inaccurate, or which are not properly projected onto images. Accordingly, it would be desirable to provide systems and methods for lean ortho correction of computer models of structures which addresses the foregoing needs.

SUMMARY

This present disclosure relates to systems and methods for lean ortho correction for computer models of structures. The system includes a transformation module which adjusts projections of computer models onto images that suffer from leaning and/or distortions present in the images, so that the images are still useful in generating and/or refining existing computer models of structures. The system displays a projection of a computer model onto an orthorectified image that suffers from leaning, and the user determines two world three-dimensional (3D) points in the image such that the second world 3D point has a height which is different than the height of the first world 3D point, and a third point where the second world 3D point is actually displayed in the image. The points can be identified by a user using a graphical user interface and an associated input device, or automatically using suitable computer vision techniques capable of identifying the points. Using the identified points, the system transforms the coordinates of the model points using a lean ortho correction algorithm, and re-projects the model onto the orthorectified image so that the projected model more accurately aligns with features of the orthorectified image.

BRIEF DESCRIPTION OF THE DRAWINGS

The foregoing features of the invention will be apparent from the following Detailed Description, taken in connection with the accompanying drawings, in which.

DETAILED DESCRIPTION

The present disclosure relates to systems and methods for lean ortho correction for computer models of structures, as discussed in detail below in connection with FIGS. 1-5.

Figure 1:
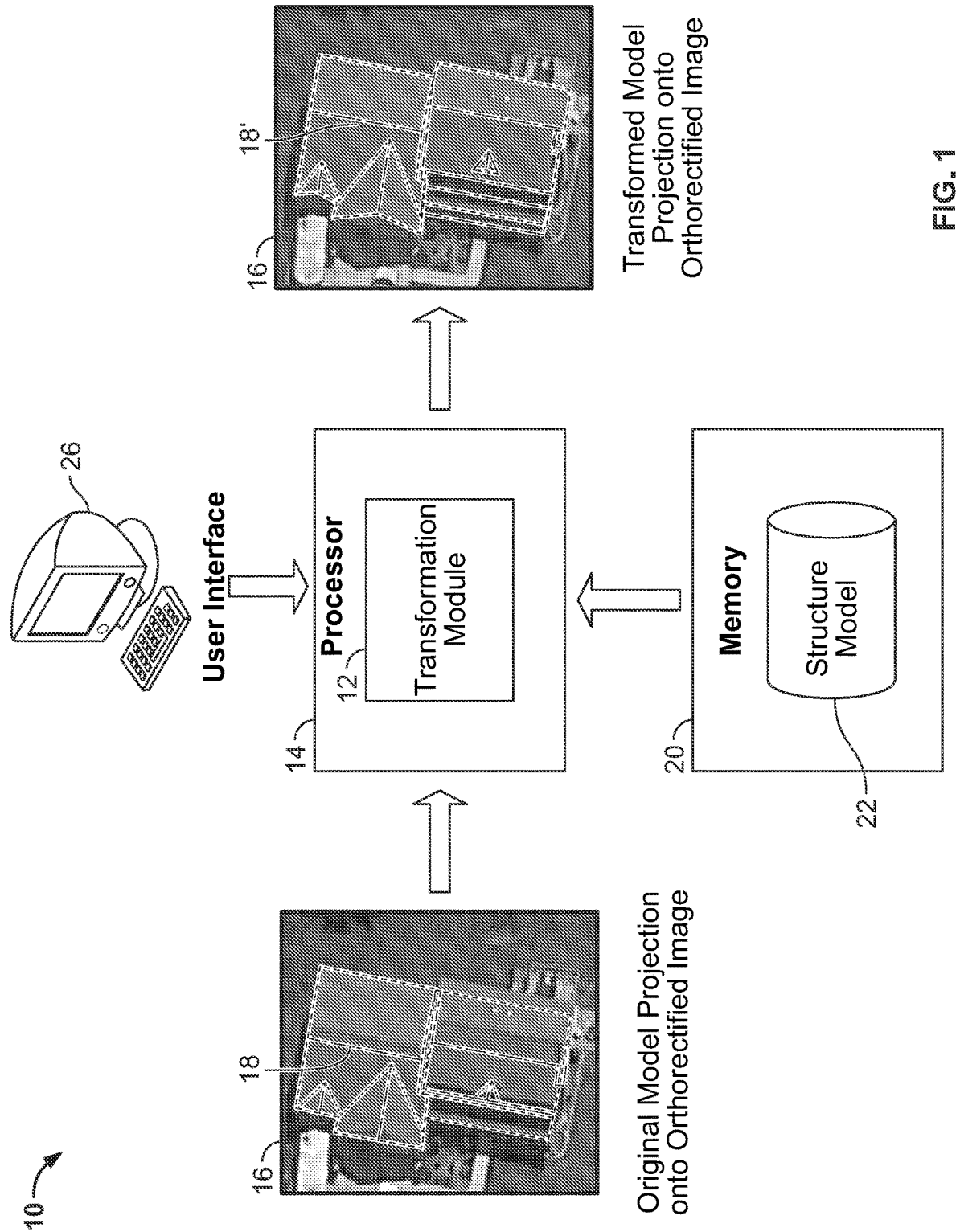
FIG. 1 is a diagram illustrating the system of the present disclosure.

FIG. 1 is a diagram illustrating the system of the present disclosure, indicated generally at 10. The system 10 includes a transformation module 12 that is executed by a processor 14 and which processes a structure model 22 stored in a memory 20 in communication with the processor 14, and a user interface 26 that communicates with the processor 14 and which can be operated by a user of the system 10. The structure model 22 could include a wireframe or polygonal model of a structure, such as a three-dimensional model of a house as shown. Importantly, the system 10 rapidly transforms coordinates of the structure model 22 to better fit an orthorectified image 16 that suffers from leaning. As can be seen in FIG. 1, when a projection 18 of the model 22 is projected onto the image 16, it can be seen that the projection 18 does not adequately align with corresponding features in the image 16 due to the presence of lean in the image 16. After processing of the model 22 using the transformation module 12 and points identified in the image 16 (as will be discussed in greater detail below), coordinates of the model 22 are transformed and the model is re-projected as projection 18' onto the image 16 as seen in FIG. 1. As can be appreciated, the transformed modeland projection 18' more closely match corresponding features in the image 16, despite the fact that the image still suffers from leaning. Advantageously, this allows a user to create/modify models of structures using digital imagery that ordinarily would not be useful for modeling due to the presence of lean in the image, thereby improving the functioning of computer modeling systems.

As will be discussed in greater detail below, points could be identified in the image 16 by the user using the user interface 26, or automatically through suitable computer vision techniques. The user interface 26 could include, but is not limited to, a display and associated keyboard and/or mouse, a touchscreen, lightpen, etc. Moreover, the process steps of the invention disclosed herein (carried out by the module 12) could be embodied as computer-readable software code executed by one or more computer systems, and could be programmed using any suitable programming languages including, but not limited to, C, C++, C#, Java, Python, or any other suitable languages. Additionally, the computer system(s) on which the present invention could be embodied include, but are not limited to, one or more personal computers, servers, mobile devices, cloud-based computing platforms, etc., each having one or more suitably powerful microprocessors and associated operating system(s) such as Linux, UNIX, Microsoft Windows, MacOS, etc. Still further, the invention could be embodied as a customized hardware component such as a field-programmable gate array (FPGA), application-specific integrated circuit (ASIC), embedded system, or other customized hardware component without departing from the spirit or scope of the present disclosure.

Figure 2:
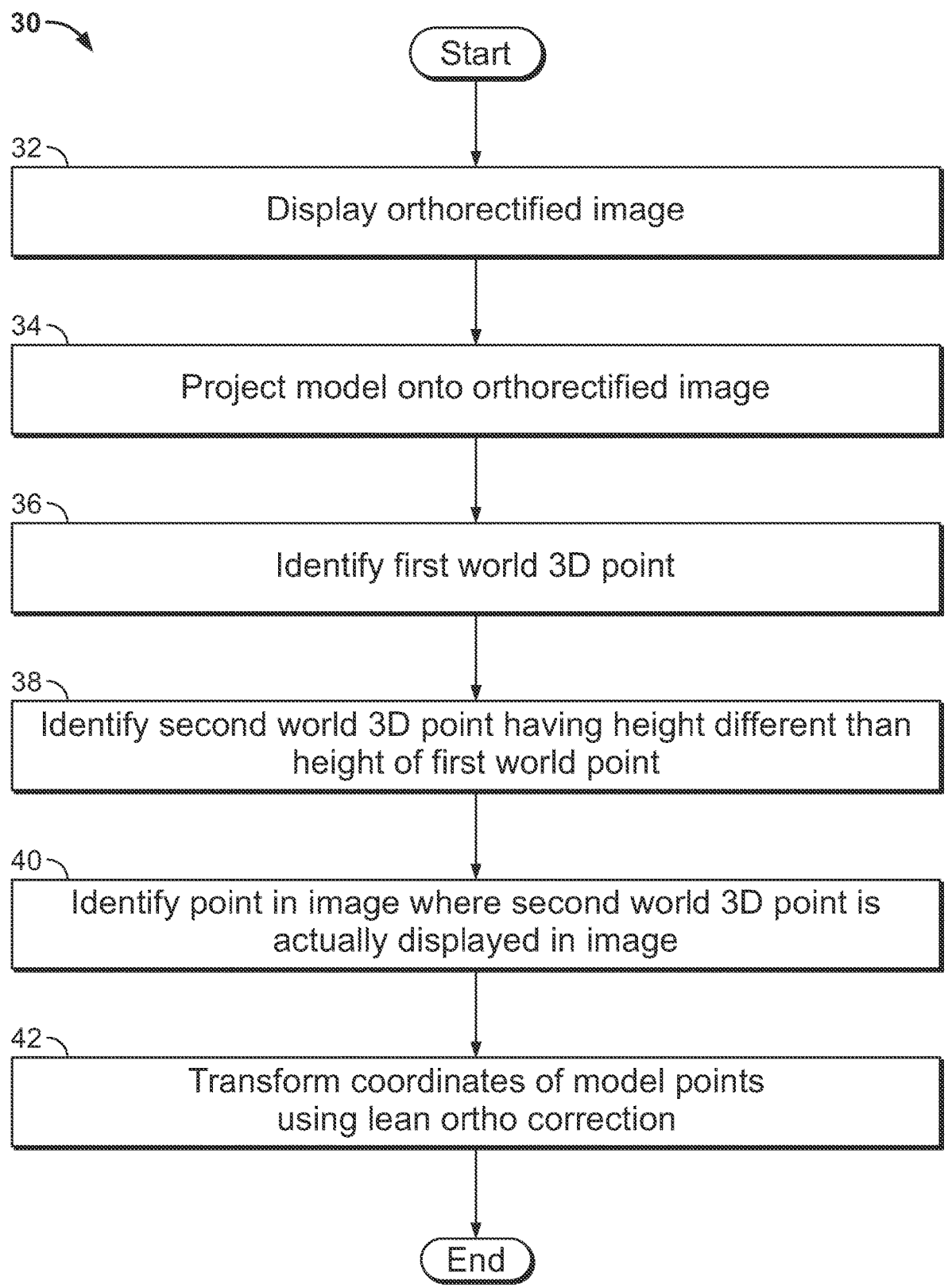
FIG. 2 is a flowchart illustrating processing steps carried out by the system.
Figure 3:
FIG. 3 depicts identification of a set of points in an orthorectified image suffering from leaning.

The specific functions carried out by the system 10 (and in particular, the transformation module 12) will now be discussed with reference to FIG. 2, which is a flowchart 30 illustrating processing steps carried out by the system of the present disclosure, and additionally with reference to FIGS. 3-5. In step 32, the system displays an orthorectified image, such as the image 50 shown in FIG. 3. The image 50 could be displayed on a screen of the user interface 26 of FIG. 1, and suffers from leaning. Next, in step 34, the system projects a projection 52 computer model of the structure (house) shown in FIG. 3 onto the image 50. As can be seen in FIG. 3, the projection 52 is a wireframe representation of the model, but not all features of the projected model match corresponding features in the image 50 due to the presence of lean in the image. Next, in step 36, the user identifies a first world three-dimensional (3D) point A shown in the image 50. As can be seen in FIG. 3, the point A corresponds to a roof corner appearing on one corner of the roof of the building shown in the image 50. Next, in step 38, the user identifies a second world three-dimensional (3D) point B shown in the image 50 having an elevation (height) which is greater than the elevation (height) of point A. As can be seen in FIG. 3, point B corresponds to one end of a roof ridge of the wireframe projection 52. Next, in step 40, the user identifies a point C in the image 50 where the second world point 3D point B actually appears in the image 50. As can be seen, point C in the image 50 shows the actual location of one end of the roof ridge that corresponds to the point B identified by the system.

Figure 4:
FIG. 4 depicts identification of an alternate set of points in the orthorectified image.
Figure 5:
FIG. 5 depicts projection of transformed computer model onto the orthorectified image after processing of model coordinates using a lean ortho correction algorithm.

FIG. 4 shows an alternate set of points that could be identified and used by the system, in the image 50. For example, as can be seen, point A is the first world 3D point corresponding to a different corner of the roof of the building shown in FIG. 4, point B is the second world 3D point in the image having a height greater that the point A, and point C is a point identifying the actual location in the image 50 corresponding to point B. It is noted that the points A, B, and C could be identified by a user pointing and clicking on the points in the image using a mouse and display of the user interface 26 of FIG. 1, or automatically identified using computer vision techniques. For example, classical computer vision approaches can be used for point detection, as well as more sophisticated systems based on deep neural networks architectures to locate keypoints.

In step 42, the system transforms the coordinates of the model using the points A, B, and C identified in the image 50 and a lean ortho correction algorithm. Two suitable algorithms could be used—one algorithm which transforms the image coordinates to the model coordinates, or a second algorithm which transforms the model coordinates to the image coordinates. If the world coordinates of a corner of the image and the pixel size (ratio between world coordinates and pixel) in both X and Y direction are known, the system can use the following algorithms to convert from pixel to world coordinates, and vice versa:

---

Algorithm 1: conversion from world coordinates to pixel coordinates on an orthorectified image

---

PixelX = (WorldX − ImageCornerXWorldCoordinate)/PixelSizeX
PixelY = (WorldY − ImageCornerYWorldCoordinate)/PixelSizeY

---

Algorithm 2: conversion from pixel coordinates to world coordinates on an orthorectified image

---

WorldX = ImageCornerXWorldCoordinate + PixelX * PixelSizeX
WorldY = ImageCornerYWorldCoordinate + PixelY * PixelSizeY

---

It is noted that the "WorldZ" in Algorithms 1 and 2 are not required to calculate pixel location. Point A in FIGS. 3-4 (Ax, Ay, Az) is a world 3D point that matches perfectly with the corresponding image pixel when applying Algorithms 1 and 2, and it is noted that the values of Ax and Ay are optional. Point B in FIGS. 3-4 (Bx, By, Bz) is a world 3D point where the height of A (Az) is different from the height of B (Bz). In this case, the corresponding image pixel should not match B when applying Algorithms 1 and 2. Point C in FIGS. 3-4 (Cpx, Cpy) is the location where point B is actually displayed in the image.

Once these points have been identified, the following can be calculated: leanZ0=Az; Bpx, Bpy=<transformation of point B from World coordinates to pixel coordinates using formula 1>; and leanVector=(Cp−Bp)/(Bz−Az). Then, Algorithms 3 and 4 can be applied to transform the model more accurately, as follows:

---

Algorithm 3: conversion from world coordinates to pixel coordinates on an orthorectified image using ortho lean correction

---

PixelX = (WorldX − ImageCornerXWorldCoordinate)/PixelSizeX + leanVectorX * (WorldZ − leanZ0)
PixelY = (WorldY − ImageCornerYWorldCoordinate)/PixelSizeY + leanVectorY * (WorldZ − leanZ0)

---

Algorithm 4: conversion from pixel coordinates to world coordinates on an orthorectified image using ortho lean correction

---

WorldX = ImageCornerXWorldCoordinate +
(PixelX − leanVectorX * (WorldZ − leanZ0)) * PixelSizeX
WorldY = ImageCornerYWorldCoordinate +
(PixelY − leanVectorY * (WorldZ − leanZ0)) * PixelSizeY

---

Once the foregoing algorithms have been applied, the coordinates of the model 22 of FIG. 1 are transformed by the system. The model 22 can then be re-projected onto the image, as is shown in FIG. 5. As can be seen in FIG. 5, the re-projection 52' of the model more closely matches corresponding features in the image 50, even though the image 50 still suffers from leaning. The image 50 can therefore still be used for future modeling tasks, such as updating the model 22, making corrections to it, adding to the model, etc. As can be appreciated, the system greatly improves the functionality of computerized modeling systems as it allows for usage of imperfect imagery (e.g., images suffering from leaning) during the process of computer modeling of structures.

Having thus described the system and method in detail, it Is to be understood that the foregoing description is not intended to limit the spirit or scope thereof. It will be understood that the embodiments of the present disclosure described herein are merely exemplary and that a person skilled in the art may make any variations and modification without departing from the spirit and scope of the disclosure. All such variations and modifications, including those discussed above, are intended to be included within the scope of the disclosure. What is intended to be protected by Letters Patent is set forth in the following claims.

The invention claimed is:

1. A system for lean ortho correction for computer models of structures, comprising:
   a processor for processing a structure model stored in a non-transitory memory;
   a user interface in communication with the processor; and
   computer system code executed by the processor, the computer system code causing the processor to:
      project the structure model onto an orthorectified image;
      identify a first world three-dimensional ("3D") point in the orthorectified image;
      identify a second world 3D point in the orthorectified image;
      identify a third world 3D point in the orthorectified image; and
      adjust the structure model by transforming coordinates of the structure model using the first world 3D point, the second world 3D point, the third world 3D point, and a lean ortho correction algorithm to compensate for lean in the orthorectified image, the lean ortho correction algorithm calculating at least one lean value and at least one lean vector for each of the first, second, and third world 3D points and applying the at least one lean value and the at least one lean vector to transform the coordinates of the structure model.

2. The system of claim 1, wherein the structure model comprises a wireframe model or polygonal model of the structure.

3. The system of claim 2, wherein the structure is a three-dimensional model of a house or a building.

4. The system of claim 1, wherein the first world 3D point corresponds to a corner of the structure.

5. The system of claim 4, wherein the second world 3D point corresponds to a point on the structure model.

6. The system of claim 5, wherein the second world 3D point has an elevation greater than the first world 3D point.

7. The system of claim 6, wherein the third world 3D point corresponds to a point on the structure model associated with the second world 3D point.

8. The system of claim 1, wherein the lean ortho correction algorithm transforms image coordinates to model coordinates.

9. The system of claim 1, wherein the lean ortho correction algorithm transforms model coordinates to image coordinates.

10. A method for lean ortho correction for computer models of structures, comprising steps of:
    projecting a structure model onto an orthorectified image;
    identifying a first world three-dimensional ("3D") point in the orthorectified image;
    identifying a second world 3D point in the orthorectified image;
    identifying a third world 3D point in the orthorectified image; and
    adjusting the structure model by transforming coordinates of the structure model using the first world 3D point, the second world 3D point, the third world 3D point, and a lean ortho correction algorithm to compensate for lean in the orthorectified image, the lean ortho correction algorithm calculating at least one lean value and at least one lean vector for each of the first, second, and third world 3D points and applying the at least one lean value and the at least one lean vector to transform the coordinates of the structure model.

11. The method of claim 10, wherein the structure model comprises a wireframe model or polygonal model of the structure.

12. The method of claim 11, wherein the structure is a three-dimensional model of a house or a building.

13. The method of claim 10, wherein the first world 3D point corresponds to a corner of the structure.

14. The method of claim 13, wherein the second world 3D point corresponds to a point on the structure model.

15. The method of claim 14, wherein the second world 3D point has a elevation greater than the first world 3D point.

16. The method of claim 15, wherein the third world 3D point corresponds to a point on the structure model associated with the second world 3D point.

17. The method of claim 10, wherein the lean ortho correction algorithm transforms image coordinates to model coordinates.

18. The method of claim 10, wherein the lean ortho correction algorithm transforms model coordinates to image coordinates.

* * * * *